US012644700B2

(12) United States Patent
Liu et al.

(10) Patent No.: US 12,644,700 B2
(45) Date of Patent: Jun. 2, 2026

(54) METHOD AND SYSTEM FOR DETECTING TIGHTNESS STATE OF BOLT OR NUT

(71) Applicant: Zhejiang Future Technology Institute (jiaxing), Jiaxing (CN)

(72) Inventors: Shuangwen Liu, Jiaxing (CN); Lei Liu, San Ramon, CA (US); Bin Hu, Jiaxing (CN); Zhuang Li, Jiaxing (CN); Wei Cao, Jiaxing (CN)

( * ) Notice: Subject to any disclaimer, the term of this patent is extended or adjusted under 35 U.S.C. 154(b) by 1117 days.

(21) Appl. No.: 16/580,451

(22) Filed: Sep. 24, 2019

(65) Prior Publication Data

US 2021/0033393 A1    Feb. 4, 2021

(30) Foreign Application Priority Data

Jul. 29, 2019    (CN) .......................... 201910690706.8

(51) Int. Cl.
| | |
|---|---|
| *G01B 21/22* | (2006.01) |
| *F16B 31/00* | (2006.01) |
| *G01L 5/24* | (2006.01) |
| *G01M 13/00* | (2019.01) |

(52) U.S. Cl.
CPC .............. *G01B 21/22* (2013.01); *F16B 31/00* (2013.01); *G01L 5/24* (2013.01); *G01M 13/00* (2013.01); *B81B 2201/0228* (2013.01)

(58) Field of Classification Search
CPC ........... G01B 21/22; F16B 31/00; G01L 5/24; G01M 13/00; B81B 2201/0228; B25B 29/02
See application file for complete search history.

(56) References Cited

U.S. PATENT DOCUMENTS

| | | | | |
|---|---|---|---|---|
| 4,013,110 A | * | 3/1977 | Darling | F16B 39/30 |
| | | | | 411/929 |
| 5,190,423 A | * | 3/1993 | Ewing | F16B 39/282 |
| | | | | 411/533 |
| 8,918,292 B2 | * | 12/2014 | Wener | G01B 5/24 |
| | | | | 702/41 |
| 9,483,674 B1 | * | 11/2016 | Fink | G06K 7/10366 |
| 2003/0059275 A1 | * | 3/2003 | Mizuno | F16B 37/00 |
| | | | | 411/386 |
| 2010/0208940 A1 | * | 8/2010 | Takman | G01B 11/165 |
| | | | | 382/103 |

(Continued)

FOREIGN PATENT DOCUMENTS

| | | | | | |
|---|---|---|---|---|---|
| CN | 201910189479 A | * | 3/2019 | | G01B 7/30 |
| CN | 109900466 A | * | 6/2019 | | |
| WO | WO-2017045666 A1 | * | 3/2017 | | G01D 5/145 |

*Primary Examiner* — Lina Cordero
*Assistant Examiner* — Lyudmila Zaykova-Feldman
(74) *Attorney, Agent, or Firm* — Jigang Jin

(57) ABSTRACT

The present invention discloses methods and systems for detecting the tightness state of a bolt or nut under inspection. A sensor is mounted on the bolt or nut. Another sensor is mounted on a structure. A first angle of the bolt or nut is calculated. A second angle of the structure is calculated. The initial angle difference between the first and second angles is calculated when the bolt or nut is tight. A subsequent angle difference between the first and second angles is calculated during the inspection. Using the initial angle difference and the subsequent angle difference, the screwed-out angle of the bolt or nut is obtained. Then, the tightness state of the bolt or nut is determined based on the screwed-out angle.

14 Claims, 2 Drawing Sheets

100

101 Acquire first data of motion and/or orientation from first sensors mounted on the bolt or nut 102 Calculate a first angle using the first data, the first angle related to rotation of the bolt or nut 103 Acquire second data of motion and/or orientation from second sensors mounted on the structure 104 Calculate a second angle using the second data, the second angle unrelated to rotation of the bolt or nut 105 Calculate the angle difference between the first and second angles 106 Obtain the initial angle difference when the bolt or nut is tight 107 Collect the first and second data and calculate the subsequent angle difference during an inspection 108 Calculate the screwed-out angle and determine the tightness state based on the screwed-out angle

(56) References Cited

U.S. PATENT DOCUMENTS

| | | | |
|---|---|---|---|
| 2013/0087091 A1* | 4/2013 | Dooner | F16B 37/14 |
| | | | 116/284 |
| 2019/0299346 A1* | 10/2019 | Hohmann | F03D 13/10 |
| 2020/0023477 A1* | 1/2020 | Hohmann | B23P 19/067 |
| 2021/0138594 A1* | 5/2021 | Ogata | G01L 5/243 |
| 2023/0127853 A1* | 4/2023 | Dey, IV | B25B 21/02 |

* cited by examiner

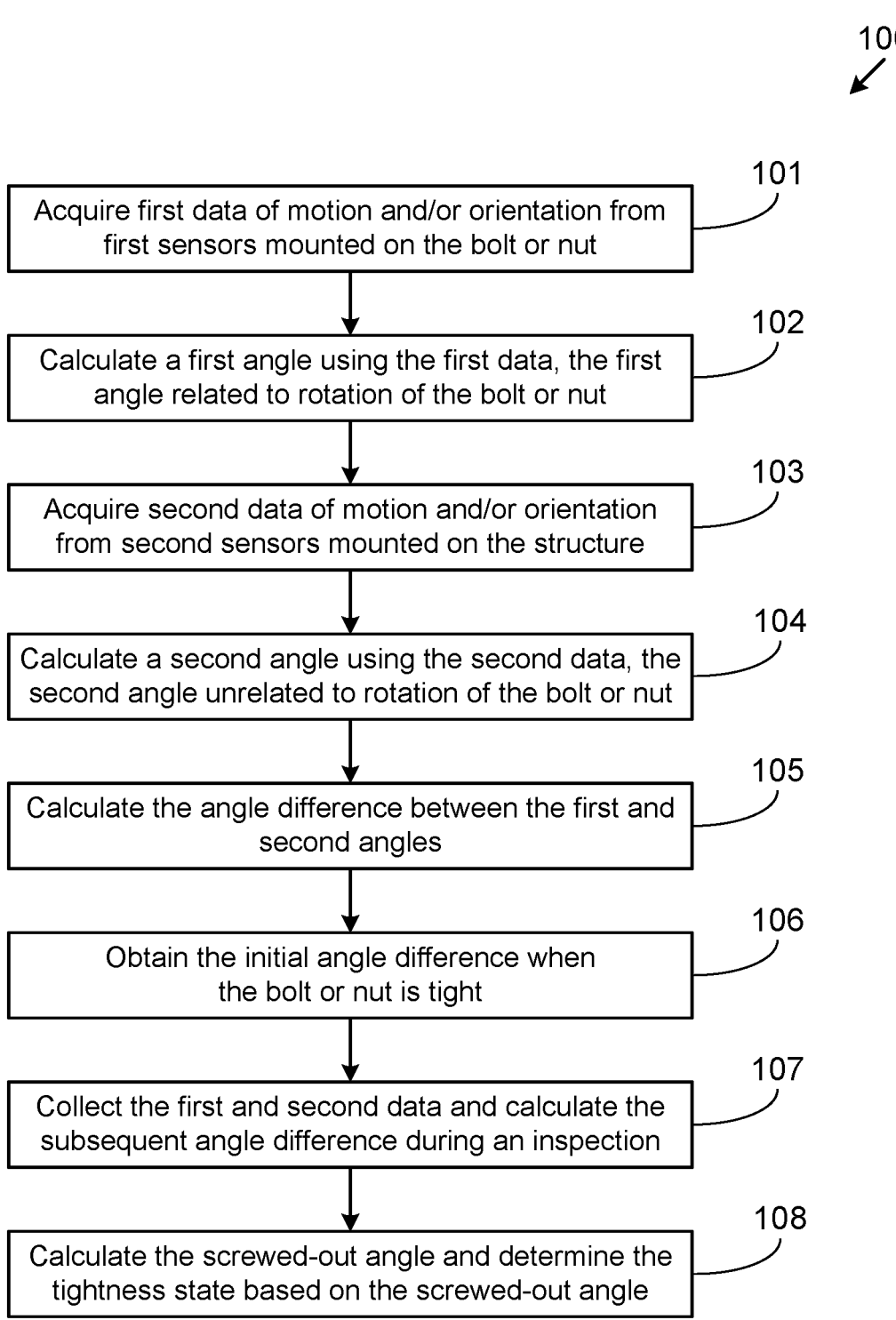

100

Acquire first data of motion and/or orientation from first sensors mounted on the bolt or nut — 101

Calculate a first angle using the first data, the first angle related to rotation of the bolt or nut — 102

Acquire second data of motion and/or orientation from second sensors mounted on the structure — 103

Calculate a second angle using the second data, the second angle unrelated to rotation of the bolt or nut — 104

Calculate the angle difference between the first and second angles — 105

Obtain the initial angle difference when the bolt or nut is tight — 106

Collect the first and second data and calculate the subsequent angle difference during an inspection — 107

Calculate the screwed-out angle and determine the tightness state based on the screwed-out angle — 108

FIG. 1

METHOD AND SYSTEM FOR DETECTING TIGHTNESS STATE OF BOLT OR NUT

CROSS-REFERENCE TO RELATED APPLICATION

This application claims priority to Chinese Patent Application No. 201910690706.8 filed on Jul. 29, 2019, the entire content of which is incorporated by reference herein.

FIELD OF INVENTION

This invention generally relates to detecting the tightness state of a bolt or nut.

BACKGROUND OF THE INVENTION

Fastening using bolts and nuts is often used for strengthening a structure or for transmission purpose. In some applications, whether a bolt or nut is tight is a crucial issue and may cause severe property damage or even fatal accidents if it becomes loose. For instance, if a car has loose wheel nuts or wheel studs, a wheel may fall off the car and an accident may happen. If bolts and nuts of a wind turbine become loose and aren't tightened in time, the rotor blade may get loose or even fall off. In some cases, a wind turbine tower may collapse due to loosened bolts or nuts. Therefore, it is necessary to monitor whether a bolt or nut is tight when the bolt or nut is used to secure a structure in certain applications.

The tightness state of a bolt or nut may be monitored manually in field inspections. The method is very laborious and time consuming and may not detect a loose bolt or nut in time. The tightness state of a bolt or nut may also be monitored electronically. For instance, stress sensors may be mounted on a bolt or nut to detect the tightness by measuring the stress directly. Such inspections may be conducted continuously or periodically and may also be performed online. But the method requires custom-made bolts and nuts so that a stress sensor can be mounted on a bolt or nut properly. Sometimes, holes are drilled on a bolt or nut for installing a stress sensor. The method has drawbacks such as high cost, limited applications, and sometimes harmful impact on the performance of a bolt or nut. Besides direct stress measurement, the tightness state of a bolt or nut may also be inspected by detecting the change of stress using ultrasonic techniques. However, the ultrasonic methods have difficulties in implementation due to vulnerability to environmental factors such as temperature and rainwater. Additionally, there are other methods to detect the tightness state of a bolt or nut. For example, a mechanical or electronic switch may be installed on or next to a bolt or nut. The switch is triggered when the bolt or nut rotates by a given angle. It provides limited detection results and lacks the ability to monitor a bolt or nut continuously or periodically. When multiple triggering angles are configured, the sensor system becomes complicated and installation of the system becomes challenging.

Therefore, there exists a need for an improved system and method to inspect the tightness state of a bolt or nut.

SUMMARY OF THE INVENTION

The present invention discloses methods and systems for detecting the tightness state of a bolt or nut. The methods and systems overcome issues caused by existing inspection methods.

The tightness state of a bolt or nut may be detected using one or more sensors such as an accelerometer, a gyroscope, and/or a magnetic field sensor. The accelerometer, gyroscope, and/or magnetic field sensors may be fabricated by the microelectromechanical systems (MEMS) technology and thus feature low power consumption, small size, and low cost. One or more of first sensors may be installed to acquire first data of motion and/or orientation of the bolt or nut. One or more second sensors may be installed to acquire second data of motion and/or orientation of a structure on which the bolt or nut is mounted. The first and second data is then used to determine the tightness state. The method is fast and reliable with low calculation consumption and cost.

In one embodiment, the method includes:

collecting the first data of motion and/or orientation using the one or more first sensors mounted on the bolt or nut;

calculating a first angle of the bolt or nut in a plane of rotation of the bolt or nut using the first data, wherein the first angle is related to rotation of the bolt or nut;

collecting the second data using the one or more second sensors mounted on the structure;

calculating a second angle of the structure in the plane of rotation of the bolt or nut using the second data, wherein the second angle is unrelated to rotation of the bolt or nut;

calculating the angle difference between the first and second angles, wherein the initial angle difference is the angle difference between the first and second angles when the bolt or nut is tight at the beginning of an inspection period;

acquiring the first and second data during the inspection period and calculating a subsequent angle difference, wherein the subsequent angle difference is the angle difference between the first and second angles obtained during the inspection period;

calculating the screwed-out angle of the bolt or nut by deducting the initial angle difference from the subsequent angle difference; and determining the tightness state of the bolt or nut based on the screwed-out angle.

In addition, the method further includes detecting the bolt or nut continuously in real time or periodically during the inspection period. The screwed-out angle is smaller than 360 degrees in a time interval between two sequential measurements and multiple measurements are arranged when the screwed-out angle goes from smaller than 360 degrees to 360 degrees and then to smaller than 360 degrees.

During an inspection, multiple measurements may be arranged such that a screwed-out angle of a measurement is smaller than 360 degrees. If a bolt or nut rotates by 360 degrees, the screwed-out angle returns to zero. Thus, when it is detected that a screwed-out angle decreases, it means a bolt or nut has rotated by more than 360 degrees. Assume that there are N times of angle decrease in an inspection period. Then the final screwed-out angle is the sum of the detected screwed-out angle and 360 degrees multiplied by N.

The one or more first and second sensors may include an accelerometer, a magnetic field sensor, and/or a gyroscope. The accelerometer may be used to measure the acceleration of the bolt or nut and the structure. The acceleration includes linear acceleration or gravitational acceleration. The velocity and displacement of the bolt or nut and the structure may be calculated based on the acceleration measurement. The magnetic field sensor may be used to measure the magnetic field such as the direction and intensity of the Earth's magnetic field or the geomagnetic field and the direction and intensity of the magnetic field surrounding the bolt or nut and the structure. The gyroscope may be used to measure the angular acceleration of the bolt, nut, and/or the structure.

The aforementioned first and second data may include gravitational acceleration, linear acceleration, centripetal acceleration, centrifugal acceleration, velocity, displacement, angular acceleration, angular velocity, angles, intensity of the geomagnetic field, and/or direction of the geomagnetic field. The angle may include an angle with regard to a reference axis of a sensor's coordinate system, an angle with regard to a reference axis of the geographic coordinate system (including the roll angle, the pitch angle, or the yaw angle), or an angle with regard to a reference axis of a reference coordinate system.

The one or more first sensors may be mounted on the bolt or nut by bonding, suction, or other fastening methods. The sensors may be attached to an outer surface, an inner surface, fully or partially embedded, or integrated with the bolt or the nut.

Similarly, the one or more second sensors may be fixed on the structure by bonding, suction, or other fastening methods. The sensors may be attached to an outer surface, an inner surface, fully or partially embedded, or integrated with the structure.

In one embodiment, the bolt or nut is threaded, which is tightened when turned and has rotation angle changes when loosened.

The detection system of the present invention may include a data collection module, a data transmission module, a data processing module, and an electric power module.

The data collection module acquires the first data from the measurement of the bolt or nut and the second data from the measurement of the structure. The first and second data includes data of motion and/or orientation. The data collection module includes the one or more first and second sensors. The one or more first and second sensors include an accelerometer for measuring acceleration and/or a magnetic field sensor for measuring the magnetic field. The one or more first and second sensors may also include a gyroscope for measuring the angular velocity.

The data transmission module enables communication and data transfer between the data collection module and the data processing module.

The data processing module performs calculations based on the first and second data. It calculates the first angle by which the bolt or nut rotates in its plane of rotation. The first angle is related to rotation of the bolt or nut. It then calculates the second angle of the structure in the plane of rotation of the bolt or nut. The second angle is unrelated to rotation of the bolt or nut. Based on results of the difference between the first and second angle in an inspection period, the total screwed-out angle or total number of turns of the bolt or nut is calculated. Then, the tightness state of the bolt or nut is determined using the total screwed-out angle or total number of turns.

The electric power module supplies electric power for the detection system.

The present invention discloses methods and systems to detect the tightness state of a bolt or nut mounted on a structure. Sensors are mounted on the bolt or nut and the structure for acquiring data of motion and/or orientation. Angles related to the rotation of the bolt or nut and unrelated to the rotation are obtained. Then the screwed-out angle of the bolt or nut is calculated and the tightness state is determined. The calculation method is simple and has low calculation cost. The method may be used to detect the tightness of the bolt or nut quickly and reliably based on the screwed-out angle. Furthermore, multiple thresholds of the screwed-out angle may be arranged in regard to certain applications. Then, a multi-level alarm system may be set up for the bolt or nut based on the multiple thresholds. In addition, multiple types of sensors may be used to detect the bolt or nut. Consequently, the tightness state may be monitored by different methods using different data of motion and/or orientation, which may make the measurement results more accurate and reliable. Therefore, the tightness state of a bolt or nut may be monitored using multiple means and a loose bolt or nut may be detected in time at low cost.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings.

FIG. 1 is a flow diagram that illustrates an exemplary process of detecting the tightness state of a bolt or nut, according to one embodiment of the present invention.

DETAILED DESCRIPTION

Figure 2:
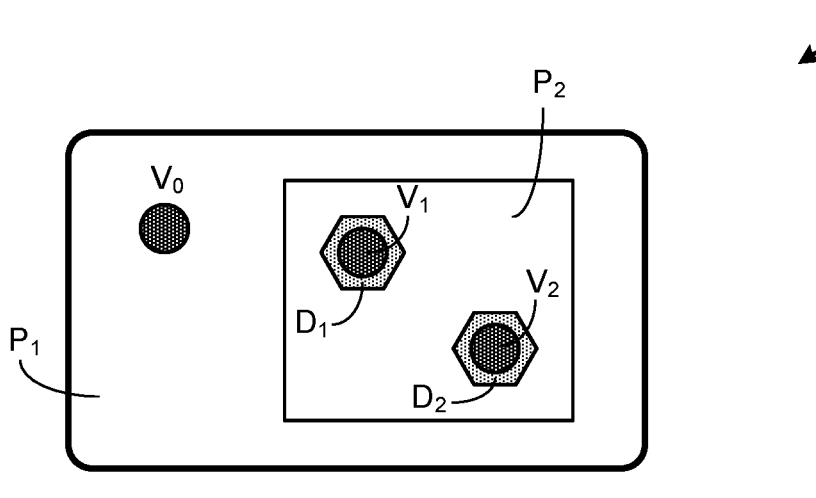
FIG. 2 shows an exemplary assembly which is used to illustrate methods and systems for detecting the tightness state of a bolt or nut, according to one embodiment of the present invention.

Detailed description of the present invention is provided below along with figures and embodiments, which further clarifies the objectives, technical solutions, and advantages of the present invention. It is noted that schematic embodiments discussed herein are merely for illustrating the invention. The present invention is not limited to the embodiments disclosed.

FIG. 1 is a flow diagram which illustrates an exemplary process 100 for detecting the tightness state of a bolt or nut, according to one embodiment of the present invention. Assume that the bolt or nut is fastened on a structure. In step 101, the first data of motion and/or orientation is acquired from one or more first sensors mounted on the bolt or nut. In step 102, the first data is used to calculate a first angle in a plane of rotation of the bolt or nut. The first angle is related to rotation of the bolt or nut. Next, the second data of motion and/or orientation is acquired from one or more second sensors mounted on the structure in step 103. The second data is used to calculate a second angle in the plane of rotation of the bolt or nut in step 104. The second angle is unrelated to rotation of the bolt or nut. In step 105, the angle difference between the first and second angles is calculated. In step 106, the initial angle difference is obtained. The initial angle difference is the angle difference when the bolt or nut is tight. In step 107, the first and second data is collected during an inspection. The subsequent angle difference, i.e., the angle difference measured during the inspection, is calculated. Then in step 108, the screwed-out angle of the bolt or nut is obtained by deducting the initial angle difference from the subsequent angle difference. The tightness state of the bolt or nut is determined based on the screwed-out angle.

FIG. 2 illustrates a diagram of an exemplary assembly 200, according to one embodiment of the present invention. Assembly 200 may be a mechanical system which is under detection in process 100. As shown in the figure, the assembly comprises a structure P1, a structure P2, a bolt or nut D1, a bolt or nut D2, and sensors V0, V1, and V2. Structure P2 is fastened on structure P1 by bolts or nuts D1 and D2. Sensors V0, V1, and V2 are mounted on structure P1 and bolts or nuts D1 and D2 respectively for detecting the tightness state of D1 and D2. Although more than one sensor may be mounted on the bolt, nut, or structure for the tightness inspection, only one sensor will be mentioned in some embodiments discussed below for simplicity reasons.

The sensors may include an accelerometer, a magnetic field sensor, or a gyroscope. Data of motion and/or orientation may be acquired using the sensors. A sensor may be mounted on a bolt or nut by bonding, suction, or other fastening methods. The sensor may be attached to an outer surface or inner surface of the bolt or nut. A sensor may also be embedded fully or partially in the bolt or nut or integrated with the bolt or nut to create an intelligent bolt or nut.

In one embodiment, the bolt or nut is threaded, which is tightened when turned and has rotation angle changes when loosened.

The accelerometer may be used to measure the acceleration of the bolt or nut. The magnetic field sensor may be used to measure the magnetic field. The gyroscope may be used to measure the angular velocity.

The data of motion and/or orientation may include acceleration, direction and intensity of the magnetic field, and/or data obtained from the gyroscope. The acceleration may include gravitational acceleration, linear acceleration, centripetal acceleration, and/or centrifugal acceleration. The data may also include velocity, displacement, and/or angle, which may be obtained through calculations using the acceleration data. Data related to the magnetic field may include the direction and intensity of the geomagnetic field, the direction and intensity of the magnetic field surrounding the bolt or nut and the structure, or an angle calculated using the data related to the magnetic field. The data acquired through a gyroscope includes the angular velocity and an angle calculated using the angular velocity.

The angle may include an angle with regard to a reference axis of a sensor's coordinate system, an angle with regard to a reference axis of the geographic coordinate system (including the roll angle, pitch angle, and yaw angle), or an angle with regard to a reference axis of a reference coordinate system.

The data of motion and/or orientation may be used to calculate an angle in a plane of rotation of the bolt or nut. The angle may be related or unrelated to rotation of the bolt or nut.

An exemplary method to detect the screwed-out angle of bolt or nut D1 is described as follows.

Bolt or nut D1 is monitored via sensor V1 which is mounted on D1. As sensor V1 is fastened on bolt or nut D1, V1 and D1 move together and share the same motion and/or orientation characteristics. The data of motion and/or orientation of sensor V1 is used to calculate an angle $\theta1$ in the plane of rotation of D1 with regard to the reference coordinate system of V1. When D1 rotates, V1 rotates in the same way and so is the reference coordinate system of V1. Thus, angle $\theta1$ changes when D1 and V1 rotate in the plane of rotation of D1. Angle $\theta1$ is related to rotation of D1.

In the meantime, data of motion and/or orientation collected by V0 is used to monitor structure P1. Because sensor V0 is fastened on structure P1, V0 and P1 move together and share the same motion and/or orientation characteristics. The data of motion and/or orientation of sensor V0 is used to calculate an angle $\theta2$ in the plane of rotation of D1 with regard to the reference coordinate system of V0. When D1 rotates, V0 doesn't rotate and neither is the reference coordinate system of V0 in the plane of rotation of D1. Thus, angle $\theta2$ doesn't change when D1 rotates in the plane of rotation of D1. Angle $\theta2$ is unrelated to rotation of D1.

Assembly 200 may be viewed as a system of rigid structure. Components of assembly 200, such as structures P1 and P2 and bolts or nuts D1 and D2, are arranged according to a predetermined configuration. The configuration remains unchanged if no one moves relative to others. Thus relative to P1, D1 and D2 have no movement or orientation change if D1 and D2 don't rotate. However, if D1 rotates, V1 also rotates. Assume that the reference axes of V0 and V1 are A0 and A1 respectively. When D1 rotates, A1 rotates in the place of rotation of D1. But AO doesn't rotate in the plane of rotation of D1. Thus, A1 rotates relative to A0 in the plane of rotation of D1. The angle by which A1 rotates relative to A0 is the screwed-out angle of D1, which is also reflected by the relative change between angle $\theta1$ and angle $\theta2$. As discussed above, angle $\theta1$ is related to rotation of D1 and angle $\theta2$ is unrelated to rotation of D1. When D1 is tight, the difference between $\theta1$ and $\theta2$ is $\Delta\theta0$. Later on, $\theta1$ and $\theta2$ are measured again in an inspection process. If the difference between $\theta1$ and $\theta2$ becomes $\Delta\theta1$, the screwed-out angle of D1 is $\Delta\theta1$-$\Delta\theta0$.

When sensors V0 and V1 are installed in an application, the XY coordinate planes of V0 and V1 may be arranged parallel to the plane of rotation of D1, which will make calculations of the screwed-out angle less complicated. Data of motion and/or orientation of V0 and V1 with regard to the XY planes may be acquired and used to obtain angles $\theta1$ and $\theta2$. Angle $\theta1$ corresponds to an angle relative to the X axis or Y axis of V1. Angle $\theta2$ corresponds to an angle relative to the X axis or Y axis of V0.

If the XY coordinate plane of V1 is not parallel to the plane of rotation of D1 after installation, calibration may be performed via software to obtain a reference axis system in the plane of rotation of D1. Angles $\theta1$ and $\theta2$ may also be calibrated with regard to the reference axis system in the plane of rotation of D1.

Because P1 and P2 are two structures fastened by the bolts or nuts, sensor V0 may be mounted on P2 as well. The calculation method to obtain the screwed-out angle of D1 remains the same as aforementioned.

Assuming that D1 is a mating bolt of a nut (not shown), then, sensor V0 may be mounted on the nut. Data of motion and/or orientation collected by V0 is used to monitor the nut. Because sensor V0 is fastened on the nut, V0 and the nut move together and share the same motion and/or orientation characteristics. Then, the data of motion and/or orientation of sensor V0 may be used to calculate an angle $\theta3$ in the plane of rotation of D1 with regard to the reference coordinate system of V0. When bolt D1 rotates, the nut may or may not rotate along with D1 in the plane of rotation of D1. The reference coordinate system of V0 may or may not rotate along with D1 either. Thus, angle $\theta3$ may or may not change when D1 rotates in the plane of rotation of D1. Angle $\theta3$ may be related or unrelated to rotation of D1. If the nut rotates along with D1 by the same rotational angle, the difference between 01 and 03 doesn't change, and the screwed-out angle is zero. If the nut and D1 rotate separately, the difference between 01 and 03 changes. The value of the change is the screwed-out angle.

Alternatively, angles $\theta1$ and $\theta3$ may also be calculated and monitored in a plane of rotation of the nut. The method to obtain the screwed-out angle remains the same.

In applications, sensors V2 and V0 may be used to detect the screwed-out angle of D2. The same method may be used to calculate the screwed-out angles of D2.

In applications, it may be assumed that the roll angle is a rotational angle about the rotation axis of D1. Then, the roll angles of V1 and V0 are θ1 and θ2 respectively. The method may be the same for the pitch or yaw angle measurement. For instance, if the axis systems of V0 and V1 are not parallel to the plane of rotation of D1 after installation, two angles in the plane of rotation of D1 may be obtained and calibrated via software calibration for V0 and V1 respectively. The difference between the two angles is the screwed-out angle of D1.

In applications, linear acceleration and/or gravitational acceleration may be measured using an accelerometer. Then the velocity may be obtained by the integral of the acceleration and the displacement may be obtained by the double integral of the acceleration. Centripetal acceleration or centrifugal acceleration may be calculated as well. Characteristics of V0 and V1 in the plane of rotation of D1 may be calculated, such as linear acceleration, gravitational acceleration, velocity, displacement, centripetal acceleration, centrifugal acceleration, and/or angles with regard to the axis system in the plane of rotation of D1. Since P1, P2, and D1 are in a rigid structural system, they share the same direction of acceleration. Angles θ1 and θ2 may be calculated, which are angles relative to the reference axis systems of D1 and P1 in the plane of rotation of D1.

In applications, the magnetic field of the environment, such as the geomagnetic field or the magnetic field surrounding the bolt or nut, may be detected using magnetic field sensors. Then, the intensity of the magnetic field in the plane of rotation of D1 may be calculated. The angles of V0 and V1 in the plane of rotation of D1 are the angles relative to the direction of the magnetic field in regard to the reference axis system of the rotational planes. Since P1, P2, and D1 are in a rigid structural system, the relative relation between the directions of the magnetic field of V0 and V1 remain unchanged if D1 doesn't rotate. Angles θ1 and θ2 may be calculated using data of the magnetic field, which are the angles between the direction of the magnetic field and the reference axes in the plane of rotation of D1. When the rigid structural system containing P1, P2, and D1 comprises hard magnetic materials or soft magnetic materials, calibration may be conducted to eliminate their effect on the measurement of the magnetic field.

In applications, the angular velocity of V0 and V1 in the plane of rotation of D1 may be detected using gyroscope sensors. Then angles of the V0 and V1 in the plane of rotation of D1 may be calculated by integral methods. As P1, P2, and D1 are in a rigid structural system, V0 and V1 have the same angular velocity if V0 or V1 is not at the rotational axis of the rigid structural system. Thus, V0 and V1 have the same angular velocity if D1 doesn't rotate. Angles θ1 and θ2 may be calculated accordingly. When V0 or V1 is at the rotational axis of the rigid structural system, characteristics other than the angular velocity may be used to calculate θ1 and θ2.

In applications, multiple types of sensors may be installed and data of motion and/or orientation from the sensors may be used to detect the tightness state of the bolt or nut. Data of motion and/or orientation which fits an application environment may be selected to calculate the screwed-out angle of the bolt or nut and make the detection more accurate.

Measurement of the screwed-out angle encounters issues when the bolt or nut completes a turn or after the screwed-out angle reaches 360 degrees. Thus, it may be arranged that the time interval between two sequential measurements is short enough and the screwed-out angle is smaller than 360 degrees between two sequential measurements. So, the accumulated screwed-out angle of the bolt or nut may be obtained through periodic measurements continuously. For instance, if the screwed-out angle is 350 degrees the previous time and 10 degrees this time, it means the bolt rotates by 20 degrees and the total screwed-out angle is 350 degrees plus 20 degrees, i.e., 370 degrees or 1.028 turn based on the screwed-out turns. Thus, whether a bolt rotates by a turn can't be determined if an inspection is based on a one-time measurement of the screwed-out angle.

The process to calculate the total screwed-out angle includes the following steps.

S1: Detect the screwed-out angle at prearranged times in an inspection period. Within a time interval between two sequential measurements, the screwed-out angle of the bolt or nut is smaller than 360 degrees. There are multiple measurements for a time period in which the screwed-out angle is greater than 360 degrees. Multiple measurements may be scheduled at different times of an inspection period. A screwed-out angle from each measurement is calculated. A series of screwed-out angles are obtained by continuous or periodic detection.

S2: The total screwed-out angle of the bolt or nut equals the addition of a screwed-out angle detected and N×360 degrees when the bolt or nut makes N round of turns.

Since the speed of a screwing-out process is relatively slow for the bolt or nut, it may be arranged such that the screwed-out angle is smaller than 360 degrees in a time interval between two sequential measurements.

The screwed-out angle increases from 0 degree after an inspection gets started and heads for 360 degrees before completing a turn. Sequential measurements may be arranged. After the bolt or nut makes a turn, the screwed-out angle decreases from a large angle to a small angle. Then the screwed-out angle increases gradually from zero degree again.

Assume a turn event reflects a process when the screwed-out angle increases in a range between zero and 360 degrees, decreases after reaching 360 degrees, and then increases again in a range between zero and 360 degrees. The number of turn events is represented by a positive integer N. Then, the total screwed-out angle of the bolt or nut is the addition of the screwed-out angle and N×360 degrees.

The present invention has the following features.

Sensors are mounted on a bolt or nut and a structure where the bolt or nut is attached to. Data of motion and orientation is acquired through the sensors. A first angle of the bolt or nut in a plane of rotation of the bolt or nut is calculated. The first angle is related to rotation of the bolt or nut. A second angle of the structure in the plane of rotation of the bolt or nut is calculated. The second angle is unrelated to rotation of the bolt or nut. The initial angle difference equals the first angle minus the second angle when the bolt or nut is tight. The subsequent angle difference is obtained by deducting the second angle from the first angle in a subsequent measurement. The screwed-out angle of the bolt or nut is obtained by deducting the initial angle difference from the subsequent angle difference. Then the tightness state of the bolt or nut is determined based on the screwed-out angle.

The calculation method is simple, and it reduces computational cost. The method may be used to detect the tightness of bolt and nut quickly, reliably, and at low cost. Multiple threshold values of the screwed-out angle may be set up when there is a need in certain applications. Then multiple alarm levels may be configured for monitoring the tightness state of the bolt or nut.

In addition, multiple types of sensors may be installed and data of motion and/or orientation from the sensors may be used to detect the tightness state of the bolt or nut more accurately.

The present invention discloses a detection system for ascertaining the tightness state of a bolt or nut. The system includes a data collection module, a data transmission module, a data processing module, and an electric power module.

The data collection module acquires data from the measurement of the bolt or nut and the measurement of the structure where the bolt or nut is attached to. The data includes data of motion and/or orientation. The data collection module includes one or more first sensors mounted on the bolt or the nut and one or more second sensors mounted on the structure. The one or more first and second sensors include an accelerometer for measuring acceleration and/or a magnetic field sensor for measuring the magnetic field. The one or more first and second sensors may also include a gyroscope for measuring the angular velocity.

The data transmission module is used for communication and data transfer between the data collection module and the data processing module.

The data processing module does calculations based on the data collected from first and second sensors. It calculates a first angle the bolt or nut rotates in its plane of rotation. The first angle is related to rotation of the bolt or nut. It then calculates a second angle the structure rotates in the plane of rotation of the bolt or nut. The second angle is unrelated to rotation of the bolt or nut. Based on results of the difference between the first and second angles in an inspection period, the total screwed-out angle or total number of turns of the bolt or nut is calculated. Then, the tightness state of the bolt or nut is determined in view of the total screwed-out angle or total number of turns.

The electric power module supplies electric power for the detection system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

We claim:

1. A method for detecting tightness state of a bolt or nut, the bolt or nut fastening a second structure on a first structure, the second structure not functioning as the bolt, and the second structure not functioning as the nut, the method comprising:

obtaining first data of motion and/or orientation of the bolt or nut via one or more first sensors, the one or more first sensors mounted on the bolt or nut, and the one or more first sensors comprising at least one of an accelerometer, a gyroscope, or a magnetometer;

calculating a first angle of the bolt or nut in a plane of rotation of the bolt or nut based on the first data, the first angle related to the rotation of the bolt or nut;

obtaining second data of motion and/or orientation of the second structure via one or more second sensors, the one or more second sensors mounted on the second structure, and the one or more second sensors comprising at least one of an additional accelerometer, an additional gyroscope, or an additional magnetometer;

calculating a second angle of the second structure in the plane of the rotation of the bolt or nut based on the second data, the second angle unrelated to the rotation of the bolt or nut;

calculating a first angle difference between the first angle and the second angle when the bolt or nut is in a tightened state;

calculating a second angle difference between the first angle and the second angle during an inspection period;

calculating a first screwed-out angle of the bolt or nut by subtracting the first angle difference from the second angle difference; and determining the tightness state of the bolt or nut based on the first screwed-out angle.

2. The method of claim 1 further comprising:

calculating a second screwed-out angle of the bolt or nut before calculating the first screwed-out angle when the first screwed-out angle is larger than 360 degrees.

3. The method of claim 1, wherein the first data is obtained in a plurality of first measurements.

4. The method of claim 1, wherein the accelerometer is used to measure acceleration of the bolt or nut, the acceleration includes linear acceleration or gravitational acceleration, velocity and displacement are calculated based on the acceleration, the magnetometer is used to measure characteristics of a magnetic field, including direction and intensity of a geomagnetic field and/or direction and intensity of the magnetic field surrounding the bolt or nut.

5. The method of claim 1, wherein the first or second data of motion and/or orientation includes gravitational acceleration, centripetal acceleration, centrifugal acceleration, linear acceleration, velocity, displacement, angular acceleration, angular velocity, angles, or intensity and direction of a geomagnetic field.

6. The method of claim 5, wherein the angles include measured angles with regard to a coordinate system of the one or more first sensors or the one or more second sensors, measured angles with regard to a geographic coordinate system including a roll angle, a pitch angle, or a yaw angle, or measured angles with regard to a reference coordinate system.

7. The method of claim 1, wherein each of the one or more first sensors is mounted on the bolt or nut by bonding, suction, or other fastening methods, each of the one or more first sensors is attached to an outer surface of the bolt or nut, an inner surface of the bolt or nut, fully or partially embedded inside the bolt or nut, or integrated with the bolt or nut, each of the one or more second sensors is mounted on the second structure by bonding, suction, or other fastening methods, each of the one or more second sensors is attached to an outer surface of the second structure, an inner surface of the second structure, fully or partially embedded inside the second structure, or integrated with the second structure.

8. The method of claim 1, wherein the bolt or nut is threaded, or the bolt or nut is a structure which is tightened when turned, or the bolt or nut is a structure which has rotation angle changes when loosened.

9. A system for detecting tightness state of a bolt or nut, the bolt or nut fastening a second structure on a first structure, the second structure not functioning as the bolt, and the second structure not functioning as the nut, the system comprising:

a data collection module configured to acquire first data in a first measurement of the bolt or nut and acquire second data in a second measurement of the second structure, the data collection module including one or more first sensors mounted on the bolt or nut and one or more second sensors mounted on the second structure, the one or more first sensors and the one or more second sensors each comprising at least one of an accelerometer, a gyroscope, or a magnetometer;

a data processing module configured to perform calculations based on the first data and the second data, wherein the data processing module is further configured to:

calculate a first angle of the bolt or nut in a plane of rotation of the bolt or nut based on the first data, the first angle related to the rotation of the bolt or nut;

calculate a second angle of the second structure in the plane of rotation of the bolt or nut based on the second data, the second angle unrelated to the rotation of the bolt or nut;

calculate a first angle difference between the first angle and the second angle when the bolt or nut is in a tightened state;

calculate a second angle difference between the first angle and the second angle during an inspection period;

calculate a screwed-out angle of the bolt or nut by subtracting the first angle difference from the second angle difference; and determine the tightness state of the bolt or nut based on the screwed-out angle; and a data transfer module configured for data transfer between the data collection module and the data processing module.

10. The system of claim 9, wherein the first and second data is collected periodically in a series of detection events during the inspection period and the screwed-out angle of the bolt or nut is calculated based on the collected first and second data in each corresponding detection event, and a time interval between any two consecutive detection events is short enough so that a difference between the screwed-out angles calculated in the any two consecutive detection events is less than 360 degrees.

11. The system of claim 9, wherein the first or second data includes gravitational acceleration, centripetal acceleration, centrifugal acceleration, linear acceleration, velocity, displacement, angular acceleration, angular velocity, angles, or intensity and direction of a geomagnetic field.

12. The system of claim 11, wherein the angles include measured angles with regard to a coordinate system of the one or more first sensors or the one or more second sensors, measured angles with regard to a geographic coordinate system including a roll angle, a pitch angle, or a yaw angle, or measured angles with regard to a reference coordinate system.

13. The system of claim 9, wherein each of the one or more first sensors is mounted on the bolt or nut by bonding, suction, or other fastening methods, each of the one or more first sensors is attached to an outer surface of the bolt or nut, an inner surface of the bolt or nut, fully or partially embedded inside the bolt or nut, or integrated with the bolt or nut, each of the one or more second sensors is mounted on the second structure by bonding, suction, or other fastening methods, each of the one or more second sensors is attached to an outer surface of the second structure, an inner surface of the second structure, fully or partially embedded inside the second structure, or integrated with the second structure.

14. The system of claim 9, wherein the bolt or nut is threaded, or the bolt or nut is a structure which is tightened when turned, or the bolt or nut is a structure which has rotation angle changes when loosened.

\* \* \* \* \*